US007619918B2

(12) United States Patent
Aritome

(10) Patent No.: US 7,619,918 B2
(45) Date of Patent: Nov. 17, 2009

(54) APPARATUS, METHOD, AND SYSTEM FOR FLASH MEMORY

(75) Inventor: Seiichi Aritome, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 305 days.

(21) Appl. No.: 11/618,661

(22) Filed: Dec. 29, 2006

(65) Prior Publication Data
US 2008/0158950 A1 Jul. 3, 2008

(51) Int. Cl.
*G11C 11/34* (2006.01)
(52) U.S. Cl. ............................. 365/185.03; 365/185.24
(58) Field of Classification Search ............ 365/185.03, 365/185.24
See application file for complete search history.

(56) References Cited

U.S. PATENT DOCUMENTS

| 6,657,891 | B1 * | 12/2003 | Shibata et al. | 365/185.03 |
|---|---|---|---|---|
| 7,020,026 | B2 * | 3/2006 | Guterman et al. | 365/185.28 |
| 7,023,733 | B2 * | 4/2006 | Guterman et al. | 365/185.17 |
| 2006/0039198 | A1 * | 2/2006 | Guterman et al. | 365/185.28 |
| 2006/0050561 | A1 * | 3/2006 | Guterman et al. | 365/185.19 |
| 2006/0193169 | A1 | 8/2006 | Nazarian | |
| 2006/0262607 | A1 | 11/2006 | Aritome | |

OTHER PUBLICATIONS

Aritome, Seiichi, et al., "Reliability Issues of Flash Memory Cells", *Proceedings of the IEEE*, vol. 81, No. 5, (May 1993), 776-788.
Atwood, Greg, et al., "Intel StrataFlash™ Memory Technology Overview", *Intel Technology Journal*, Q4'97, (1997), 1-8.
Lee, June, et al., "A 90-nm CMOS 1.8-V 2-Gb NAND Flash Memory for Mass Storage Applications", *IEEE Journal of Solid-State Circuits*, vol. 38, No. 11, (Nov. 2003), 1934-1942.

* cited by examiner

*Primary Examiner*—Michael T Tran
(74) *Attorney, Agent, or Firm*—Schwegman, Lundberg & Woessner, P.A.

(57) ABSTRACT

Methods, apparatus, systems, and data structures are disclosed, including a plurality of multiple level memory cells, each of the plurality of multiple level memory cells coupled to one of a plurality of wordlines and each of the plurality of multiple level memory cells including a plurality of logical memory pages; a control circuit coupled to the plurality of wordlines, the control circuit operable to progressively program each of the plurality of multiple level memory cells in at least one sequence including separation of the programming of a first logical memory page and a second logical memory page in any one of the plurality of multiple level memory cells by at least N−1 programming operations to memory cells either coupled to a different wordline or included in a different logical even page or a different logical odd page.

29 Claims, 7 Drawing Sheets

| | LOWER-1 | LOWER-2 | LOWER-3 | UPPER | LOWER-1 | LOWER-2 | LOWER-3 | UPPER |
|---|---|---|---|---|---|---|---|---|
| | 410 | 412 | 414 | 416 | 420 | 422 | 424 | 426 |
| WL31 | 236 | 244 | 250 | 254 | 237 | 245 | 251 | 255 |
| WL30 | 228 | 238 | 246 | 252 | 229 | 239 | 247 | 253 |
| WL29 | 220 | 230 | 240 | 248 | 221 | 231 | 241 | 249 |
| WL28 | 212 | 222 | 232 | 242 | 211 | 223 | 233 | 243 |
| WL8 | 52 | 62 | 72 | 82 | 53 | 63 | 73 | 83 |
| WL7 | 44 | 54 | 64 | 74 | 45 | 55 | 65 | 75 |
| WL6 | 36 | 46 | 56 | 66 | 37 | 47 | 57 | 67 |
| WL5 | 28 | 38 | 48 | 58 | 29 | 39 | 49 | 59 |
| WL4 | 20 | 30 | 40 | 50 | 21 | 31 | 41 | 51 |
| WL3 | 446 12 | 448 14 | 24 | 42 | 447 13 | 449 15 | 33 | 43 |
| WL2 | 442 6 | 444 8 | 450 16 | 34 | 443 7 | 445 9 | 25 | 35 |
| WL1 | 440 2 | 444 4 | 10 | 26 | 441 3 | 445 5 | 17 | 27 |
| WL0 | 440 0 | | | 18 | 441 1 | | 11 | 19 |
| | | EVEN PAGE 404 | | | | ODD PAGE 406 | | |

*FIG. 4*

APPARATUS, METHOD, AND SYSTEM FOR FLASH MEMORY

TECHNICAL FIELD

Various embodiments described herein relate generally to memory devices, including flash memory devices.

BACKGROUND

Memory devices can be categorized in two broad areas: volatile and non-volatile. Volatile memory devices require power to maintain data, while non volatile memories are capable of maintaining data in the absence of a power supply. An example of a non-volatile memory is the flash memory that stores information in a semiconductor device without the need for power being supplied to the semiconductor device in order to maintain the information in the semiconductor device.

Flash memory may be built using either NOR or NAND devices. NAND flash may be either of single-level cell (SLC) or multiple-level cell (MLC) configuration. MLC NAND flash allows for a higher density memory device in comparison to SLC NAND flash because it allows the storage of two or more data bits in each memory cell.

BRIEF DESCRIPTION OF THE DRAWINGS

FIG. 4 illustrates a chart showing programming sequences according to various embodiments of the invention;

DETAILED DESCRIPTION

Figure 1:
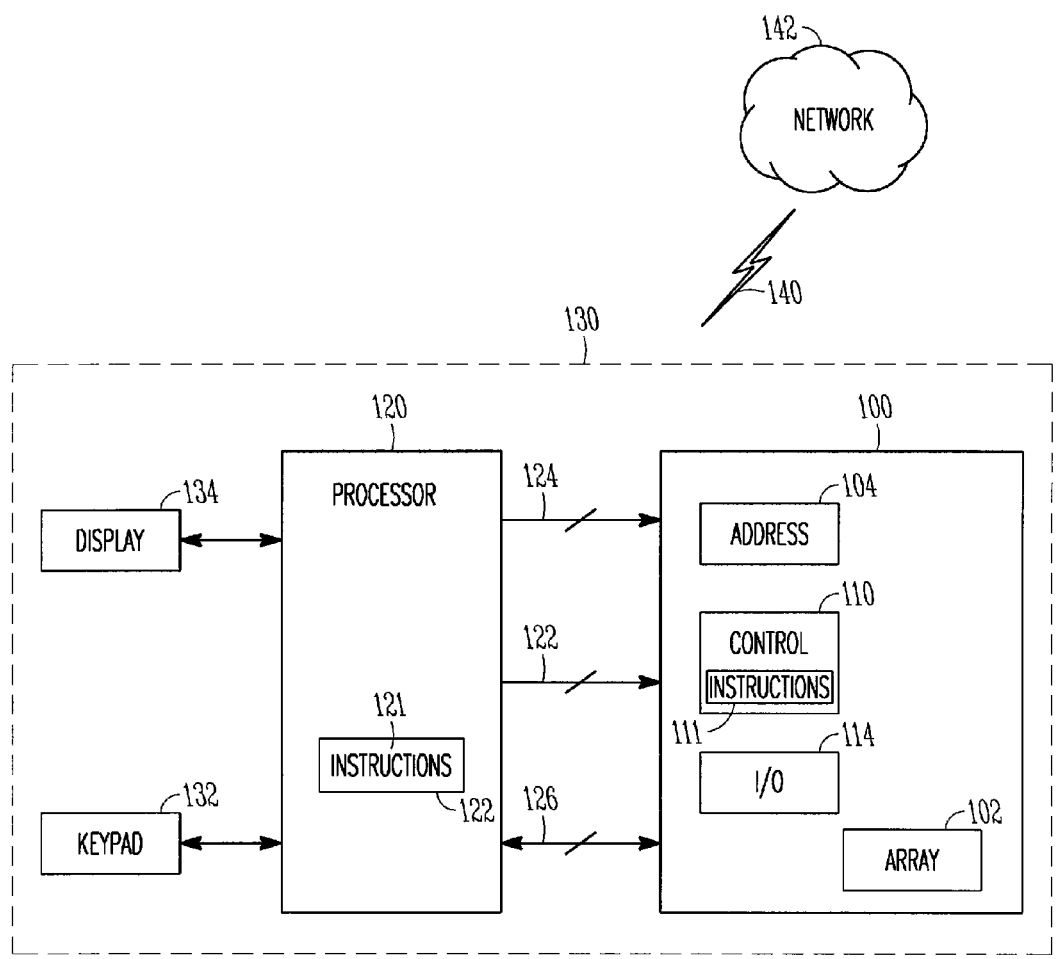
FIG. 1 illustrates a block diagram of a memory system according to various embodiments of the invention.

In a multiple level NAND flash memory cell, tight threshold voltage distribution is important. Tight control over programming refers to the ability to program threshold voltages in a multiple level memory cell within any one of designated ranges of threshold voltages so that the programmed threshold voltage properly represents the data intended to be stored in the multiple level memory cell.

For example, in a 4-bit per cell memory device wherein 4 bits of data may be stored in a single memory cell, 16 states are needed. Each state is generally represented by a defined range of threshold voltages that may be programmed into a multiple level memory cell in order to represent a particular state. If the threshold voltages programmed into the memory cells are not in the intended range of threshold voltages, the memory cells will not properly represent the data that was intended to be stored into the memory cells. In addition, even if the threshold voltage as originally programmed into the cells was within the proper range for the intended data, if the threshold voltage is not maintained within the proper range, the data stored in the memory cell will be corrupted or lost.

In various embodiments of multiple level memory devices, the memory cells have been miniaturized so significantly that the spacing between adjacent cells in the row direction and the column direction is very narrow. As the distance between adjacent cells becomes shorter, the capacitance between the floating gates of adjacent cells (FG-FG capacitance) becomes larger. This may result in a problem wherein the threshold voltage of a cell first written into varies according to the data written into an adjacent cell. This variation in the threshold voltage $V_{th}$ of the first cell is related to the FG-FG capacitance. A variation in the threshold voltage in an already programmed cell may thus be altered by a variation in the programmed threshold voltage due to floating gate-to-floating gate FG-FG interference created by the programming of the adjacent multiple level memory cell. Thus, reduced (FG-FG) interference is also required in order to realize a tight threshold voltage distribution that remains in the intended threshold voltage range for the data programmed into the memory cell.

In programming multiple level memory cells, one or more states for threshold voltages may be harder to properly program than other states. For example, as data bits are programmed into any given memory device, the ranges for the voltages distributions may be required to become smaller, and have less spacing between adjacent voltage ranges. Therefore, a more precise programming of the threshold voltages may be required in order to properly program the memory cell. As the last data bits are programmed into the memory cell, the last state closest to and adjacent to the state representative of an erased memory cell may be more difficult to program than other states that are farther away in voltage from the threshold voltage representative of an erased memory cell. This last state closest to the state of an erased memory cell is sometimes referred to as the lowest positive threshold voltage.

Various embodiments described herein provide for maintaining the tight threshold voltage distributions required for proper operations involving multiple level memory cells while minimizing the negative effects of program disturb and FG-FG interference.

FIG. 1 is a simplified block diagram of an integrated circuit memory device 100 in accordance with one or more embodiments of the invention. The memory device 100 includes a memory array 102, address circuitry 104, control circuitry 110, and Input/Output (I/O) circuitry 114. In various embodiments, memory array 102 includes a plurality of non-volatile floating gate memory cells. In various embodiments, memory array 102 includes multiple level NAND flash memory cells. The memory cells may also referred to as flash memory cells because blocks of memory cells are erased concurrently in a flash operation.

The memory device 100 can be coupled to a processor 120 or other memory controller for accessing the memory array 102. The memory device 100 coupled to a processor 120 forms part of an electronic system 130. In various embodiments, electronic system 130 may include a display 134. In various embodiments, electronic system may include a device for inputting data into electronic system 130, for example but not limited to keypad 132. Some examples of electronic systems include personal computers, peripheral devices, wireless devices, digital cameras, personal digital assistants (PDAs), and audio recorders. Electronic systems may also include office voice-mail PBX systems, cell phones, network routers, digital voice recorders, laptop and hand held computers, set top boxes, and Universal Serial Bus (USB) flash drives.

The memory device 100 receives control signals across control lines 122 from the processor 120 to control access to the memory array 102 via control circuitry 110. Access to the memory array 102 is directed to one or more target memory cells in response to address signals received across address lines 124. Once the array is accessed in response to the control signals and the address signals, data is written to or read from the memory cells across data, DQ, lines 126.

In various embodiments, processor 120 includes instructions 121, wherein the instructions 121 may be stored on a machine-readable medium. In various embodiments, the instructions 121 include instructions for performing operations including the memory array 102, including but not limited to programming operations according to one or more embodiments described herein. In various embodiments, memory device 100 will store instructions 111 on a machine-readable medium, for example but not limited to, instructions 111 stored in the control circuitry 110. In various embodiments, instructions 111 include instructions for programming memory array 102 according to one or more embodiments described herein.

In various embodiments, electronic system 130 is coupled to a network 142 through link 140. Network 142 is not limited to any particular type of network. In various embodiments, network 142 is the Internet. Link 140 is not limited to any particular type of link. In some embodiments, link 140 includes physical conductors, such as but not limited to wires, transmission lines, or bus cables. In some embodiments, link 140 is a wireless connection.

It will be appreciated by those skilled in the art that additional circuitry and control signals can be provided, and that the memory device of FIG. 1 has been simplified to help focus on the embodiments described herein. It will be understood that the above description of a memory device is intended to provide a general understanding of the memory device and is not a complete description of all the elements and features of a typical memory device.

Flash memory is nonvolatile memory that can be erased and reprogrammed in units of memory called blocks. A write operation in any flash device may generally only be performed on an empty/erased unit, so in most cases an erase operation must precede the write operation.

Figure 2:
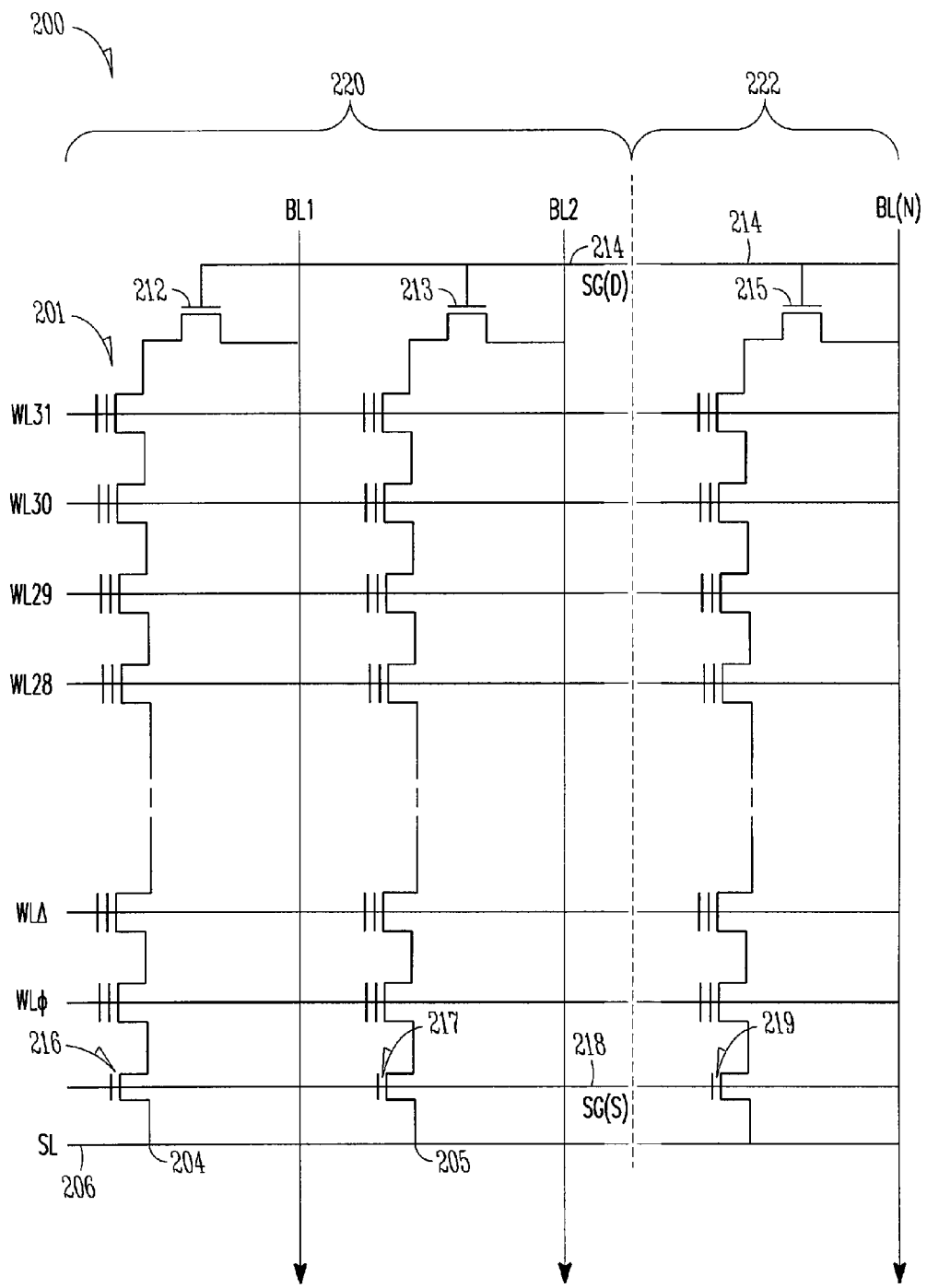
FIG. 2 illustrates a schematic diagram showing an array of memory cells according to various embodiments of the invention.

FIG. 2 illustrates a schematic diagram of a NAND flash memory array 200, according to various embodiments of the invention. Memory array 200 does not show all of the elements typically used in a memory array. For example, only three bit-lines are shown (BL-1, BL-2 and BL-(N)) while the number of bit-lines employed actually depends on the memory density. The bit-lines are subsequently referred to as (BL1-BL(N)).

The NAND flash memory array 200 includes a plurality of floating gate memory cells 201 arranged in series of strings 204, 205, and 206. Each of the floating gate memory cells 201 may be coupled drain to source in each series string 204, 205, and 206. The wordlines (WL0-WL31) span across multiple series strings 204, 205, and 206 and are coupled to the control gates of every floating gate memory cell 201 in a row in order to control their operation. The bit-lines (BL1-BL(N)) are eventually coupled to sense amplifiers (not shown) that detect the state of each floating gate memory cell 201.

In various embodiments, a plurality of the strings 204, 205, and 206 may be designated as being in a first even/odd logical page 220, and a plurality of the strings 204, 205, and 206 may be designated as being in a second even/odd logical page 222. In various embodiments, memory array 200 may include more than two logical pages. In various embodiments, the first even/odd logical pages and the second even/odd logical pages may be referred to simply as the "logical page."

In operation, the word-lines (WL0-WL31) select a row of the individual floating gate memory cells in series strings 204, 205, and 206 that are to be written to or read from, and operate the remaining floating gate memory cells in each series string 204, 205, and 206 in a pass-through mode. Each series string 204, 205, and 206 of floating gate memory cells is coupled to a source line 206 by a source select gates 216, 217, 219 and to an individual bit-line (BL1-BL(N)) by a drain select gates 212, 213, and 215. The source select gates 216, 217, and 219 are controlled by a source select gate control line SG(S) 218 coupled to their control gates. The drain select gates 212, 213, and 215 are controlled by a drain select control line SG(D) 214. In various embodiments, source select gate control line SG(S) 218 and drain select control line SG(D) 214 may be controlled by for example control circuitry 110, or by address circuitry 104, as shown in FIG. 1.

Returning to FIG. 2, in various embodiments, operations such as reading and programming (writing) are performed on selected memory cells included in the plurality of floating gate memory cells 201. The selected memory cells may be selected on the basis of a selected wordline and a selected logical page. In various embodiments, when selecting a particular even/odd logical page, the operation being performed on the selected memory cells is not performed on the memory cells coupled to the selected wordline but designated as included in a different even/odd logical page from the selected even/odd logical page. In other words, memory cells that are coupled to a same wordline may still include some memory cells that are selected because they are designated as being in a particular even/odd logical page, and some memory cells that are not selected because they are designated as being in a different even/odd logical page. In various embodiments, this differentiation in the selection of memory cells coupled to a same wordline may be controlled by controlling which bitlines BL1-BL(N) and which source select gates 216, 217, and 219 and which drain select gates 212, 213, and 215 are activated.

In various embodiments, each memory cell may be programmed as a multiple level memory cell. Multiple level memory cells allow programming multiple bits per cell. Each cell's threshold voltage ($V_{th}$) determines the data that is stored in the cell. For example, in a single bit per cell architecture, a $V_t$ of 1V might indicate a programmed cell while a $V_{th}$ of −1V might indicate an erased cell. The multilevel cells have more than two $V_{th}$ windows, each indicating a different state. Multiple level memory cells take advantage of the analog nature of a traditional flash cell by assigning a bit pattern to a specific threshold voltage range stored on the cell. This technology permits the storage of two or more bits per cell, depending on the quantity of voltage ranges assigned to the cell.

For example, a memory cell storing 2 bits of data may be assigned four different threshold voltage distributions, each having a width of approximately 400 mV. In various embodiments, a separation of 0.3V to 0.5V is assigned between each threshold voltage distribution range as well. This separation zone between the threshold voltage distributions is established so that the multiple threshold voltage distributions do not overlap causing logic errors. During verification, if the voltage stored on the cell is sensed to be within the 01 high threshold voltage distribution, then the cell is storing a 01. If the voltage is within the 00 second highest distribution, the cell is storing a 00. This continues for as many ranges (levels) as are used for the memory cell.

During a programming operation, the selected word line (WL) for the flash memory cell to be programmed may be supplied with a train of high voltage programming pulses. The high voltage programming pulses may start at 16V and may increment in 0.5V increments. In various embodiments, a 10V non-incrementing, high voltage pulse is applied on the unselected WLs.

To inhibit selected cells from programming on the selected WLs, in one embodiment, the channel of the inhibited cell is decoupled from the bit-line (BL) by applying ~2.5V on the BL. To program selected cells on the selected WL, the channel may be grounded to 0V through the BL. The large potential formed between the channel and the WL is designed to cause the cell to program and the $V_t$ of the device will increase as higher programming pulses are applied.

In various embodiments, between every programming pulse, a verification phase is performed. During verification, the selected WL may be lowered to 0V, the unselected WLs may be lowered to 5V, and the states of the selected cells are sensed. If the cell is programmed to have a $V_t$ level such that the 0V on the WL does not induce the device to conduct, the device may be considered to be programmed. Otherwise, the cell is considered to be erased and the programming pulse height is increased by 0.5V and applied to the selected WL again. This process is repeated until all selected cells to be programmed have indeed been programmed.

In a read operation, the word line of a target (selected) memory cell can be maintained at a low voltage level. All unselected cell word lines can be coupled to a voltage sufficiently high to activate the unselected cells regardless of their floating gate charges. If the selected cell has an uncharged floating gate, it is activated. The bit line and source line are then coupled through the series of memory cells in the array. If the selected cell has a charged floating gate, it will not activate. The bit line and source lines in that case are not coupled through the series of memory cells.

A typical memory block may comprise 64 logical pages for 1 bit/cell memory devices. The 64 logical pages can be formed with 32 physical WLs. Each WL may contain 2 logical pages. In various embodiments, there may be 4K bytes of cells on a WL. Of these, 2K bytes may be designated as included in one logical page that shares the same WL with another 2K bytes designated as being included in a different logical page. If every cell is used in a multiple level mode for example with 4 data bits per memory cell, then a WL with the described configuration will hold 4 pages having 2K bytes per page total. In a 4 data bit per memory device example, 4 pages times 2K bytes per page times 32 wordlines equals 256 logical pages.

When one of these pages is being programmed, the second page on the same WL will experience a disturb condition even though it is inhibited. Therefore pages with shared WLs can experience programming disturb. The programming disturb caused on the shared WL will shift the threshold voltage distribution of cells that are previously programmed in the second page that is on the same WL and make their distribution wider. For non-volatile memory devices that use two levels per cell this may not be a major problem, since the separation zone between the two distributions may be large enough to prevent the distributions from overlapping due to the disturb condition. However, for multiple level memory cell operations where a single cell is used to represent 4 bits or 16 levels per memory cell, the separation zone for the threshold voltages representing each of the possible states for these data bits is reduced, and reducing the disturb condition becomes desirable in order to prevent threshold voltage distributions from overlapping or shifting.

Figure 3:
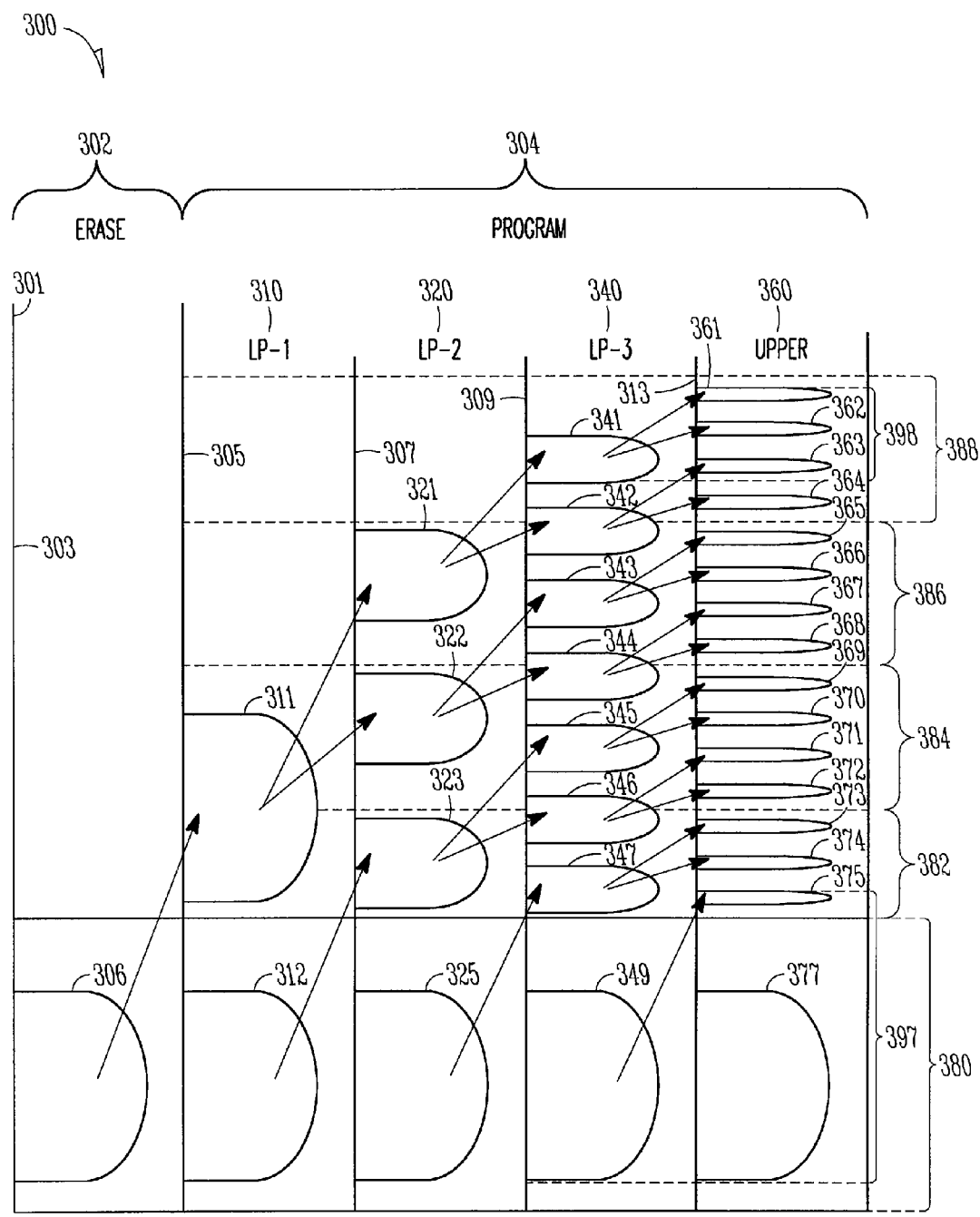
FIG. 3 illustrates a chart showing threshold voltage distributions according to various embodiments of the invention.

FIG. 3 illustrates a chart 300 showing threshold voltage distributions for a plurality of multiple level memory cells 301.

A threshold voltage distribution represents a designated range of threshold voltages for a plurality of multiple level memory cells. Any memory cells having a threshold voltage that is within the designated range of threshold voltages for the threshold voltages distribution is programmed to a particular state associated with the threshold voltage distribution. A particular state associated with the threshold voltages included in the threshold voltage distribution may represent a state for a memory cell that has been erased. A particular state associated with the threshold voltages included in the threshold voltage distribution may represent a state for a particular data bit programmed into a memory cell. A particular state associated with the threshold voltages included in the threshold voltage distribution may represent a state for a particular combination of data bits programmed into a memory cell.

In chart 300, each multiple level memory cell may store 4 bits of data. In various embodiments, each of the memory cells represented by the threshold voltage distributions of chart 300 are coupled to a same wordline. In various embodiments, each of the multiple level memory cells 301 represented by the threshold voltage distributions of chart 300 are included in either a same logical "even page" of memory cells coupled to the same wordline, or are included in a same logical "odd page" of memory cells coupled to the same wordline. In addition, "logical memory page" refers to multiple level memory cell operable to store more than one data bit per memory cell, wherein each data bit is stored into one of the logical memory pages included in a multiple level memory cell. By way of example, a multiple level memory cell operable to store 4 data bits includes 4 logical memory pages. In various embodiments, the four logical memory pages are referred to as the first lower page LP-1, the second lower page LP-2, the third lower page LP-3, and upper pager UPPER.

Chart 300 includes a column 302, a column 304, and row 380, row 382, row 384, row 386, and row 388. Column 302 includes vertical line 303. Column 304 includes columns 310, 320, 340, and 360, and vertical lines 305, 307, 309, and 313. Vertical lines 303, 305, 307, 309, and 313 represent ranges of threshold voltages for memory cells 301. The ranges of threshold voltages along vertical lines 303, 305, 307, 309, and 313 is not limited to any particular range of voltages. In various embodiments, row 380 represents an area along the vertical lines including one or more ranges of threshold voltages included in memory cells that have been erased. In various embodiments, the ranges of threshold voltages included in row 380 represent a particular value, for example a "1" or a "0," for one of the data bits being stored in each of the memory cells 301. In various embodiments, the threshold voltages in row 380 represent negative voltages, and the threshold voltages in rows 382, 384, 386, and 388 represent positive voltages.

Rows 382, 384, 386, and 388 each represent one or more ranges of threshold voltages included in memory cells 301 that have been programmed. In various embodiments, row 382 represents three separate ranges 373, 374, and 375 of threshold voltage distributions that each represent one of three of the 16 threshold voltage distributions provided in a 4 bit multiple level memory cell. In various embodiments, row 384 represents four separate ranges 369, 370, 371, and 372 of threshold voltage distributions that each represent one of four of the 16 threshold voltage distributions provided in a 4 bit multiple level memory cell. In various embodiments, row 386 represents four separate ranges 365, 366, 367, and 368 of threshold voltage distributions that each represent one of four of the 16 threshold voltage distributions provided in a 4 bit multiple level memory cell. In various embodiments, row 388 represents four separate ranges 361, 362, 363, and 364 of threshold voltage distributions that each represent one of four of the 16 threshold voltage distributions provided in a 4 bit multiple level memory cell.

In various embodiments, threshold voltage distribution 306 may be a threshold voltage distribution following a erasure process performed on the memory cells 301. In various embodiments, threshold voltage distribution 306 represents a range of threshold voltages that would indicate for any memory cell having a threshold voltage within threshold voltage distribution 306 that the memory cell has been erased.

In various embodiments, vertical lines 303, 305, 307, 309, and 313 represent the threshold voltages distributions of memory cells 301 at different point in the programming process. In various embodiments, vertical line 303 represents the threshold voltage distributions 306 in a memory cell during a time represented by column 302. In various embodiments, column 310 including vertical line 305 may represent the ranges of threshold voltage distributions 311 and 312 for the memory cells having the first lower page LP-1 programmed. In column 310, threshold voltage distribution 311 may represent a range of threshold voltages present in memory cells having a certain value, for example a "0" programmed as the first data bit, and the threshold voltage distribution 312 representative of a range of threshold voltages having a different value, for example a "1" programmed as the first data bit.

In various embodiments, column 320 includes vertical line 307 and threshold voltage distributions 321, 322, 323, and 325 representative of threshold voltage distributions for memory cells having the first lower page LP-1 and the second lower page LP-2 programmed. In various embodiments, threshold voltage distribution 321 represents a particular value for the first data bit combined with one of the possible values for the second stored data bit, and threshold voltage distribution 322 represents the particular value for the first data bit combined with a different one of possible values for the second stored data bit. This is indicated by the arrows between threshold voltage distribution 311 and each of threshold voltage distributions 321 and 322 respectively.

In various embodiments, threshold voltage distribution 323 represents another value stored in the first data bit combined with one of the possible values for the second stored data bit, and the threshold voltage distribution 325 represents the another value stored in the first data bit combined with a different one of the possible values for the second stored data bit. This is indicated by the arrow between threshold voltage distribution 312 and the threshold voltage distribution 323. In various embodiments, threshold voltage distribution 325 is representative of a value stored in both the first data bit and the second data bit that corresponds with the value stored in lower page LP-1 and LP-2 as a result of the erase operation performed on memory cells 301.

By way of example, as a result of programming the first lower page LP-1 in any memory cells, for any memory cells intended to have a value of "0" stored in the first logical memory page, these memory cells may have a threshold voltage somewhere in the range represented by threshold voltage distribution 311, and for any memory cells intended to have a value of "1" stored in the first logical memory page, these memory cells may have a threshold voltage somewhere in the range represented by threshold voltage distribution 312.

As a result of further programming including the second lower page LP-2, the intended values to be stored in the second logical memory page of each memory cell are programmed into the memory cells, resulting in the threshold voltage distributions of column 320. Continuing with the example, in column 320 threshold voltage distribution 321 may represent memory cells intended to have a value of "01" stored in the first and second logical memory page, threshold voltage distribution 322 may represent memory cells intended to have a value of "00" stored in the first and second logical memory page, threshold voltage distribution 323 may represent memory cells intended to have a value of "10" stored in the first and second logical memory page, and threshold voltage distribution 325 may represent memory cells intended to have a value of "11" stored in the first and second logical memory page.

By progressively programming the first lower page LP-1 and the second lower page LP-2, the intended data values to be stored in each memory cell may be added to each memory cell in a sequential manner. The term "progressively" refers to the programming of each logical memory page of a memory cell using a programming process that sequentially adds a data value for one bit of data stored in the memory cell. This may be referred to as "soft programming" of the memory cells. In various embodiments, the progressive or soft programming is accomplished by incrementally stepping up, for each different logical memory page programmed, the value of the voltage provided as the programming pulses.

In various embodiments, column 340 includes vertical line 309 and threshold voltage distributions 341, 342, 343, 344, 345, 346, 347, and 349, representative of threshold voltage distributions for memory cells having the first lower page LP-1, the second lower page LP-2, and the third lower page LP-3 programmed. In various embodiments, threshold voltage distributions 341-347 and 349 may be a result of progressive programming performed on memory cells 301 in order to program a third data bit into each of memory cells 301. In various embodiments, this progressive programming process for the third lower page LP-3 is represented by the arrows between the threshold voltage distribution 321, 322, 323, and 325 of column 320 and the threshold voltage distributions 341-347 of column 340.

In various embodiments, each of threshold voltage distributions 341-347 and 349 represents one of 8 possible combinations of data that may exist in a memory cell programmed with three data bits. In column 340, each of threshold voltage distributions 341-347 may include a smaller threshold voltage range than may be included in the threshold voltage distributions 321, 322, and 323 of column 320. The progressive programming process to program the third lower page LP-3 results in three data bits being stored into each memory cell 301 while providing tight threshold voltage distributions.

In various embodiments, column 360 includes vertical line 313 and threshold voltage distributions 361-375 and 377, representative of threshold voltage distributions for memory cells having the first lower page LP-1, the second lower page LP-2, the third lower page LP-3, and the upper page UPPER programmed. In various embodiments, threshold voltage distributions 361-375 and 377 may be a result of progressive programming performed on memory cells 301 in order to program a fourth data bit into each of memory cells 301. In various embodiments, this progressive programming process for the upper page UPPER is represented by the arrows between the threshold voltage distributions 341-347 and 349 of column 340 and the threshold voltage distributions 361-375 of column 360.

In various embodiments, each of threshold voltage distributions 361-375 and 377 represents one of 16 possible combinations of data that may exist in a memory cell programmed with four data bits. In column 360, each of threshold voltage distributions 341-375 includes a smaller threshold voltage range than may be included in the threshold voltage distributions 341-347 of column 340. The progressive programming process to program the upper page UPPER results in four data bits being stored into each of memory cells 301 while providing tight threshold voltage distributions.

In various embodiments, the progressive programming of the first lower page LP-1, the second lower page LP-2, the third lower page LP-3, and the upper page UPPER may be done sequentially on a particular group of memory cells 301, wherein each logical memory page is programmed in order and as the very next programming operation without performing any programming operations that do not involve the same particular group of memory cells 301.

Various embodiments may also include progressive programming wherein programming operations are performed on one or more logical memory pages of a particular group of memory cells 301, and wherein programming operations are performed on other logical memory pages of memory cells 301 not included in the particular group of memory cells 301 in between the programming of the logical memory pages of the partial group of memory cells 301.

FIG. 4 illustrates a chart 400, showing an embodiment including a sequence used for programming a block of memory cells 401. Memory cells 401 are coupled to wordlines 402, including 32 word lines WL0 through WL31. Memory cells 401 include a logical even page 404 of memory cells coupled to wordlines 402. Memory cells 401 include a logical odd page 406 of memory cells coupled to wordlines 402. Each of wordlines 402 are coupled to memory cells 401 in both the logical even page 404 and the logical odd page 406.

Chart 400 includes a plurality of logical page numbers 430. Logical page numbers 430 include logical page numbers from 0 (zero) to 255. Each logical page number 430 is located in one of columns 410, 412, 414, and 416, or one of columns 420, 422, 424, and 426.

Column 410 includes logical page numbers 430 included in the first lower page LP-1 for memory cells coupled to wordlines WL0 through WL31 and included in the logical even page 404. Column 412 includes logical page numbers included in the second lower page LP-2 for memory cells coupled to wordlines WL0 through WL31 and included in the logical even page 404. Column 414 includes logical page numbers included in the third lower page LP-3 for memory cells coupled to wordlines WL0 through WL31 and included in the logical even page 404. Column 416 includes logical page numbers included in the upper page UPPER for memory cells coupled to wordlines WL0 through WL31 and included in the logical even page 404.

Column 420 includes logical page numbers 430 included in the first lower page LP-1 for memory cells coupled to wordlines WL0 through WL31 and included in the logical odd page 406. Column 422 includes logical page numbers included in the second lower page LP-2 for memory cells coupled to wordlines WL0 through WL31 and included in logical odd page 406. Column 424 includes logical page numbers included in the third lower page LP-3 for memory cells coupled to wordlines WL0 through WL31 and included in the logical odd page 406. Column 426 includes logical page numbers included in the upper page UPPER for memory cells coupled to wordlines WL0 through WL31 and included in the logical odd page 406.

In various embodiments, the logical page numbers 430 represent the sequence used in programming the memory cells 401 included in a block of memory cells. A first programming process 440 is performed at logical page number 0, which is the first lower page LP-1 of the memory cells coupled to wordline WL0 and designated as included in the logical even page 404. A second programming process 441 is performed at logical page number 1, which is the first lower page LP-1 of the memory cells coupled to wordline WL0 and designated as the logical odd page 406. A third programming process 442 is performed at a logical page number 2, which is the first lower page LP-1 of memory cells coupled to wordline WL1 and designated as the logical even page 404. A fourth programming process 443 is performed at logical page number 3, which is the first lower page LP-1 of memory cells coupled to wordline WL1 and designated as the odd logical page 406. A fifth programming process 444 is performed at logical page number 4, which is the second lower page LP-2 of memory cells coupled to wordline WL0 and designated as the logical even page 404.

By using this sequence of programming, at least three other programming processes are performed between the programming process 440 on logical page number 0 and logical page number 4. By using this sequence of programming, the adjacent logical memory pages for the memory cells on a same wordline and a same designated logical even/odd page are programmed by progressive programming processes separated by at least three other programming processes, the at least three other programming processes being performed on logical page numbers 430 of memory cells on either a different wordline or included in a different logical even/odd page from the memory cells having a first and a second logical memory pages programmed.

As the programming sequence continues, this same separation by at least three programming processes is maintained for each of the logical page numbers 430 included in memory cells 401. In various embodiments, following programming process 445, programming process 446, programming process 447, programming process 448, programming process 449, and programming process 450 are performed on logical page numbers 5, 6, 7, 8, and 9 respectively. For each of these logical page numbers, at least three other programming processes are performed on logical page numbers either on a different wordline or included in a different logical even/odd page before returning to the same wordline and the same logical even/odd page to program the next logical memory page of the memory cell having a first and a second logical memory pages programmed.

By way of example, the second programming process 441 includes programming logical page number 1, which is the first lower page LP-1 of memory cells coupled to WL0 and included in the logical odd page 406. Before programming the second logical memory page of memory cells coupled to the same wordline and included in the same logical page is performed as programming process 445, programming processes 442, 443, and 444 are performed on logical page numbers of memory cells coupled to a different wordline or designated as being included in a different logical even/odd page. In various embodiments, this pattern of separation may be repeated to include programming all of the memory cells 401.

By providing the separation between programming processes as shown in FIG. 4, and by progressively programming up from lower page LP-1 to upper page UPPER through the logical page numbers for the memory cells as shown for example in FIG. 3, the FG-FG interference is reduced, while still maintaining the tight threshold voltage distributions need in order to provide properly programmed multiple level memory cells.

In general terms, the programming sequence provided in the embodiments described herein may prevent at any given time a programmed memory cell, the programmed memory cell having one or more logical memory pages M in the memory cell programmed with data, from being adjacent to any other memory cells have less than M−1 logical memory pages programmed. M is a positive integer less than or equal to N, wherein N is a positive integer equal to the number of data bits the memory cells being programmed are operable to store. The term "adjacent to any memory cells" includes and refers to any memory cells that are coupled to a wordline one wordline above or one wordline below the wordline to which the programmed memory cells is coupled. The term adjacent to also includes and refers to any memory cells coupled to the same wordline as the wordline coupled to the programmed memory cell but on a different logical even/odd logical page than the programmed memory cell.

The programming scheme minimizes the differences between the shifts in threshold voltages required to program memory cells that are adjacent to already programmed memory cells, and in doing so reduced the occurrence of FG-FG interference throughout the programming sequence of a plurality of memory cells.

Various embodiments include an apparatus comprising a plurality of multiple level memory cells, each of the plurality of multiple level memory cells coupled to one of a plurality of wordlines and included in either a logical even page or a logical odd page coupled to each one of the plurality of wordlines, each of the plurality of multiple level memory cells including N logical memory pages, wherein N is an integer equal to the number of data bits each of the plurality of multiple level memory cells is operable to store; and at least one of the plurality of multiple level memory cells including a programmed memory cell having all of the N logical memory pages included in the programmed memory cell programmed with a data bit, the programmed memory cell coupled to a first wordline of the plurality of wordlines and the programmed memory cell included in either the logical even page or the logical odd page coupled to the first wordline; wherein any of the plurality of multiple level memory cells either coupled to a wordline adjacent to the first wordline or coupled to the first wordline and on a different logical even page or a different logical odd page from the programmed memory cell have at least N−1 logical memory pages programmed with a data bit, and at least one of the any of the plurality of multiple level memory cell has no more than N−1 logical memory pages programmed.

Various embodiments, include an apparatus wherein at least one of the any of the plurality of multiple level memory cells has no more than N−1 logical memory pages programmed when all of the plurality of multiple level memory cells either coupled to a wordline adjacent to the first wordline or coupled to the first wordline and included in a different logical even page or a different logical odd page from the programmed memory cell have at least N−1 logical memory pages programmed with data bits.

Returning to FIG. 4, Embodiments are not limited to including three programming operations between each of the programming operations of memory cells on the same wordline and the same logical even/odd page. In some embodiments, more than three programming operations may be performed on memory cells on a different wordline and a different logical even/odd page between performing a first programming procedure and a second programming procedure on a given memory cell.

Embodiments of the invention are not limited to the sequence shown in FIG. 4. In various embodiments, the programming sequence may begin on a wordline other than wordline WL0. In various embodiments, the programming sequence may begin on the logical page designated as the odd page. It would be understood that many combination of sequences for programming the logical page numbers of the memory cells may be performed while still providing the separation between a first and a second programming operation being performed on a given memory cell. For any particular wordline and logical even/odd page, the programming process as described above with respect to FIG. 4 may include the memory cells 301 being progressively programmed as described in association with the particular wordline and logical even/odd page progressing thorough the threshold voltages as shown by columns 310, 320, and 340, and 360 respectively in FIG. 3.

Embodiments are not limited to memory cells operable to store a particular number of memory bits. In various embodiments, memory cells operable to store 2 data bits per memory cell may be used, in which case the programming of a first and a second logical memory pages of a memory cell may be separated by at least 1 programming operation including memory cells either not on a same wordline or not on a same logical even/odd page as the memory cells having the first and second logical memory pages programmed. In various embodiments, memory cells operable to store 3 data bits per memory cell may be used, in which case the programming of a first and a second logical memory pages of a memory cell may be separated by at least 2 programming operations including memory cells either not on a same wordline or not on a same logical even/odd page as the memory cells having the first and second logical memory pages programmed.

In various embodiments, any programming sequence wherein the number of programming operations separating the programming of a first logical memory page and a second logical memory page of a multiple level memory cell is equal to N−1, wherein N is an positive integer equal to the number of bits a particular memory cell is operable to store, and wherein the programming operations separating the programming of the first logical memory page and the second logical memory page includes programming operations on memory cells either on a different wordline or on a same wordline and a different logical even/odd page from the wordline and logical even/odd page of the memory cells including the first logical memory page and the second logical memory page to be programmed.

Figure 5:
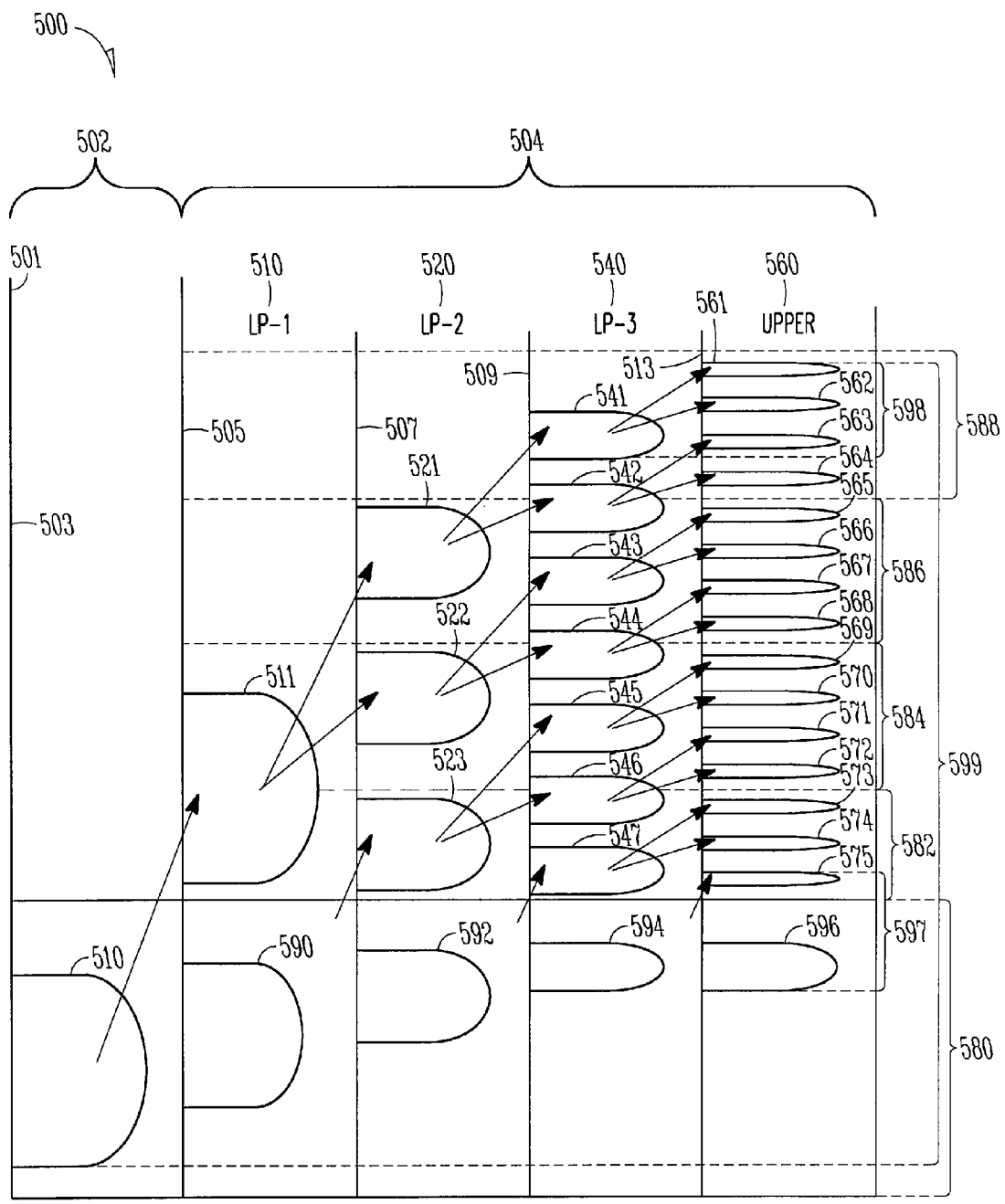
FIG. 5 illustrates a chart showing threshold voltage distributions according to various embodiments of the invention.

FIG. 5 illustrates a chart 500 showing one or more embodiments of programming multiple level memory cell programming. Chart 500 illustrates threshold voltage distributors resulting from progressive programming processes performed on memory cells 501 including erase compaction.

In FIG. 5, reference numbers having the same last two digits as reference number in FIG. 3 correspond to the same type of features as described for FIG. 3, and so a detailed description of these features in FIG. 5 is not repeated.

In various embodiments, row 580 in FIG. 5 differs from row 380 of FIG. 3 in that erase compaction is applied to the programming process of the embodiments illustrated in chart 500.

In various embodiments, erase compaction may be used to make tight threshold voltage distributions in the programmed multiple level memory cells. In FIG. 5, column 502 show a threshold voltage distribution 510 representative of a range of threshold voltages for memory cells 501 after all of memory cells 501 have been erased.

Column 510 includes threshold voltage distributions 511 and 590, representative of threshold voltages distributions following a programming of the first lower page LP-1 of memory cells 501. Column 520 includes threshold voltage distributions 521-523 and 592, representative of threshold voltages distributions following a programming of the first lower page LP-1 and the second lower page LP-2 of memory cells 501. Column 540 includes threshold voltage distributions 541-547 and 594, representative of threshold voltages distributions following a programming of the first lower page LP-1, the second lower page LP-2, and the third lower page LP-3 of memory cells 501. Column 560 includes threshold voltage distributions 561-577 and 596, representative of threshold voltages distributions following a programming of the first lower page LP-1, the second lower page LP-2, the third lower page LP-3, and the UPPER page of memory cells 501.

In various embodiments, threshold voltage distribution 590 represents a range of threshold voltages representative of erased memory cells 501 that is smaller than threshold voltage distribution 510, and includes a range of threshold voltages that is closer in voltage to the lowest threshold voltage 511 representative of programmed memory cells after the first lower page LP-1 programming is completed. In various embodiments, programming of the first lower page LP-1 is performed by applying a programming step pulse having a first voltage to each of the memory cells being programmed.

In various embodiments, after programming using the program step pulse, a compaction verification operation is performed. A compaction verification operations in some embodiments is similar to a erase verification operations performed on a memory cell, which may include providing 0 volts on the wordlines WL0-WL31, providing 3.5 volts on the drain side select gate and the source side select gate lines, providing 1.0 volts at the source, and providing 0 volts on the bitlines. In various embodiments, after applying these voltages a measurement is performed wherein a current is measured for each of the series strings included in the memory cells being programmed. A erase compaction pass or failure is determined based on the measured string current. A smaller string current means a tight erase threshold voltage distribution and an erase threshold voltage distribution that is closer to the lowest positive threshold voltage distribution.

If the compaction verification is complete and passes, the programming of the particular logical page is considered complete. If the compaction verification fails, than the voltage level used in the programming pulse is incremented, and the incremented voltage level programming pulse is again applied to the memory cell or cells where the compaction verification operation was determined to be a failure.

In various embodiments, threshold voltage distribution 592 represents a range of threshold voltages representative of erased memory cells 501 that is smaller than threshold voltage distribution 510 and smaller than threshold voltage distribution 590, and includes a range of threshold voltages that is closer in voltage to the lowest threshold voltage 523 representative of programmed memory cells after first lower page LP-1 and the second lower page LP-2 programming is completed. In various embodiments, programming of the second lower page LP-2 is performed by applying a programming step pulse having a second voltage that is less than the first voltage applied when programming the first lower page LP-1. In various embodiments, process of providing program pulses, performing compaction verification, and incrementing the programming pulse voltage level and re-applying program pulse to the memory cell is included in programming a wider threshold voltage distribution, for example but not limited to, threshold voltage distribution 592.

In various embodiments, threshold voltage distribution 594 represents a range of threshold voltages representative of erased memory cells 501 that is smaller than threshold voltage distributions 510, 590, and 592, and includes a range of threshold voltages that is closer in voltage to the lowest threshold voltage 547 representative of programmed memory cells after the first lower page LP-1, second lower page LP-2, and the third lower page LP-3 programming is completed. In various embodiments, programming of the third lower page LP-3 is performed by applying a programming step pulse having a third voltage that is less than the second voltage applied when programming the second lower page LP-2

In various embodiments, threshold voltage distribution 596 includes threshold voltage distributions having a "width" or a range of threshold voltages that is the same as the width or range of threshold voltages for threshold voltage distribution 594. In various embodiments, threshold voltage distribution 596 includes about the same range of threshold voltages that are included in threshold voltage distribution 594. In various embodiments, programming of the UPPER page is performed by applying a programming step pulse having a forth voltage that is less than the second voltage applied when programming the third lower page LP-3.

As shown in FIG. 5, the difference in threshold voltages 597 between the lowest threshold voltage in threshold voltage distribution 594 and the highest threshold voltage in threshold voltage distribution 575 is less than the difference in threshold voltages 397 as shown for example in FIG. 3 between the lowest threshold voltage in threshold voltage distribution 349 and the and the highest threshold voltage in threshold voltage distribution 375. Thus, the use of erase compaction in one or more steps of the programming operations provides for smaller differences between threshold voltage distributions being programmed in each step, and thus provides a difference between voltage distributions that is more like the difference in threshold voltages for already programmed data such as the threshold voltage distribution difference 598 as shown in FIG. 5. The smaller differences in threshold voltage distributions between programming steps provide for a smaller amount of FG-FG interference while programming the memory cells 501.

In a conventional programming sequence that does not include step programming or erase compaction, a threshold voltage shift may be as large as the difference in threshold voltages 599 as shown in FIG. 5. This large voltage shift may create a FG-FG interference that may corrupt the data being programmed into one or more adjacent memory cells 501. By programming memory cells 501 using erase compaction, and progressively programming the first lower page, the second lower page, the third lower page and then the UPPER page, the FG-FG coupling may be reduced, and thus provide tighter threshold voltage distributions for the programmed memory cells while minimizing FG-FG interference.

Figure 6:
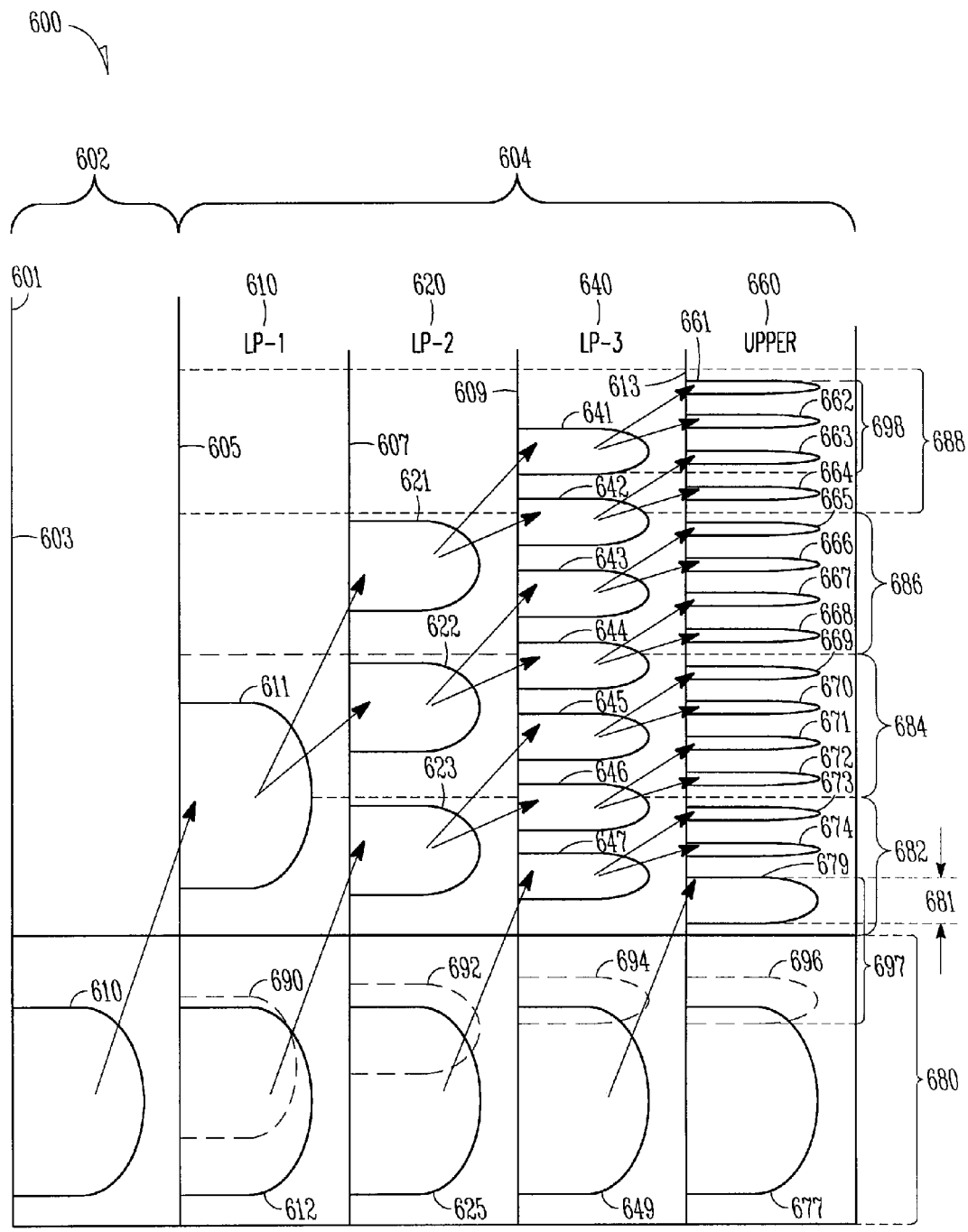
FIG. 6 illustrates a chart showing threshold voltage distributions according to various embodiments of the invention.

FIG. 6 illustrates a chart 600 showing one or more embodiments including MLC memory cell programming. Chart 600 illustrates threshold voltage distributors resulting from progressive programming processes performed on memory cells 601 using erase compaction.

In FIG. 6, reference numbers having the same last two digits as reference numbers in FIG. 3 and in FIG. 5 correspond to the same type of features as described for FIG. 3 and for FIG. 5, and so a detailed description of these features in FIG. 6 is not repeated here.

In various embodiments, row 680 may include the threshold voltage distributions 610, 612, 625, 649, and 677 for memory cells as was described with respect to threshold voltage distributions 310, 312, 325, 349, and 377 of FIG. 3. In various embodiments, erase compaction may be applied in the programming of memory cells 601 in chart 600, wherein row 680 may include the threshold voltage distributions 610, 690, 692, 694, and 696 for memory cells as was described with respect to the threshold voltage distributions 510, 590, 592, 594, and 596 of FIG. 5.

In various embodiments, column 660 includes threshold voltage distributions 661-674 and threshold voltage distribution 679. In various embodiments, threshold voltage distribution 679 includes a wider range of threshold voltages, or a wider 681 "setting," than any of the threshold voltage distributions 661-674. Threshold voltage distribution 679 may be the threshold voltage distribution closest to the range for the threshold voltage distributions 677 or 696 representative of the voltage distributions of erased memory cells. Threshold voltage distribution may be referred to as the lowest positive threshold voltage distribution because threshold voltage distribution 679 is the threshold voltage distribution that includes a range of the lowest positive threshold voltages included in a threshold voltage distribution associated with a state for a programmed memory cell.

By providing threshold voltage distribution 679 having a wider 681 setting, a reduction in the number of programming failures resulting from not being able to provide a threshold voltage for a given memory cell within the smaller positive threshold voltage ranges, such as threshold voltage ranges 661-674. In general it is difficult to achieve a narrow threshold voltage distribution for a given group of memory cell when the threshold voltages are programmed from a wider threshold voltage distribution. This is due to factors such as overprogramming and program variation, with is correlated to the threshold voltage shift occurring during programming.

By way of example, in programming upper page UPPER page as shown in column 660, the threshold voltage shift in programming threshold voltage range 661 or 662 from threshold voltage range 641 in column 640 includes a smaller threshold voltage shift 698 than as would be need in programming threshold voltage range 661 or 662 from threshold voltage 649 in column 640. Further, in programming upper page UPPER as shown in column 660, threshold voltage distribution 679 provides a wider 681 setting for a range of threshold voltages that, when programmed from for example voltage distribution 649, are still within the recognized range of threshold voltages associated with a state designated by threshold voltage distribution 679. By providing a wider 681 range for threshold voltage distribution 679, it is more likely that the programming of any memory cell for threshold voltages within the threshold voltage range 679 will be more successful if threshold voltage range 6797 is wider, than if threshold voltage range 679 were the same width as threshold voltage ranges 661-674.

If the programming of threshold voltages into threshold voltage distribution 679 is preformed from threshold voltage distribution 694, which includes erase compaction, than the maximum shift in threshold voltages may not exceed the threshold voltage shift 697. The smaller shift in threshold voltage shift 697 as compared to threshold voltage shift 397 of FIG. 3, combined with the wider threshold voltage distribution 679, also reduces the occurrence of programming failure in programming threshold voltages into the threshold voltage distribution 679.

Figure 7:
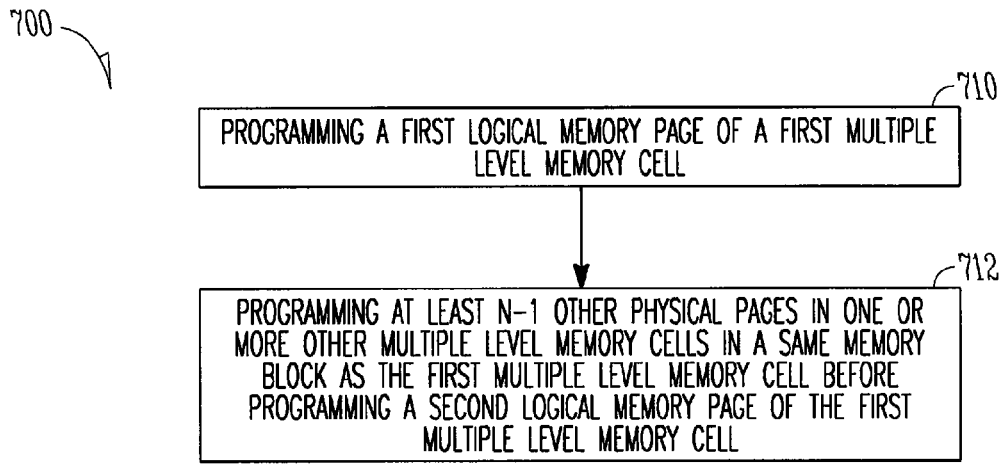
FIG. 7 illustrates a flow diagram showing one or more methods according to various embodiments of the invention.

FIG. 7 is a flow diagram including several methods according to various embodiments of the invention.

Method 700 may include at block 710 programming a first logical memory page of a first multiple level memory cell. In various embodiments, the first logical memory page is one of a first lowered page, a second lower page, and a third lower page of the first multiple level memory cell. In various embodiments, the second logical memory page of the first multiple level memory cell is the second lower page if the first logical memory page is the first lower page of the first multiple level memory cell. In various embodiments, the second logical memory page of the first multiple level memory cell is an UPPER page if the first logical memory page is the third lower page of the first multiple level memory cell.

Method 700 may include at block 712 programming at least N-1 other logical memory pages in one or more other multiple level memory cells in a same memory block as the first multiple level memory cell before programming a second logical memory page of the first multiple level memory cell, wherein N is a integer equal to the number of data bits the first multiple level memory cell is operable to store.

In various embodiments, programming the at least N-1 other logical memory pages includes programming as a first of the at least N-1 other logical memory pages a first logical memory page of a second multiple level memory cell of the one or more other multiple level memory cells, wherein the second multiple level memory cell is coupled to a same wordline as the first multiple level memory cell, and is in a different logical page as a logical page that includes the first multiple level memory cell.

In various embodiments, programming the at least N-1 other logical memory pages includes programming as a second of the at least N-1 other logical memory pages a first logical memory page of a third multiple level memory cell of the one or more other multiple level memory cells, wherein the third multiple level memory cell is coupled to a different wordline from the same wordline coupled to the first multiple level memory cell, and is in the logical page that includes the first multiple level memory cell. In various embodiments, the different wordline is a next adjacent wordline the same memory block.

In various embodiments, programming the at least N other logical memory pages includes programming as a third of the at least N-1 other logical memory pages a second logical memory page of a second multiple level memory cell of the one or more other multiple level memory cells, wherein the second multiple level memory cell is coupled to a different wordline from the same wordline that includes the first multiple level memory cell, and is in a different logical page as a logical page that includes the first multiple level memory cell.

In various embodiments, programming at least N other logical memory pages includes programming three other logical memory pages and next programming a second logical memory page of the first multiple level memory cell.

In various embodiments, programming at least N other logical memory pages includes programming at least two other logical memory pages for a memory device including memory cells including 3 bit per cell memory cells. In various embodiments, programming at least N other logical memory pages includes programming at least three other logical memory pages for a memory device including memory cells including 4 bits per cell memory cell. In various embodiments, programming at least N other logical memory pages includes programming at least four other logical memory pages for a memory device including memory cells including 5 bits per cell memory cell. It would be understood that this pattern of programming other logical pages in a memory cell separated by a number N of logical memory pages in other memory cells may be used for memory cells including more than 5 bits per memory cell.

In various embodiments, programming at least N other logical memory pages includes programming at least two other logical memory pages for a memory device including memory cells including 3 bit per cell memory cells.

Figure 8:
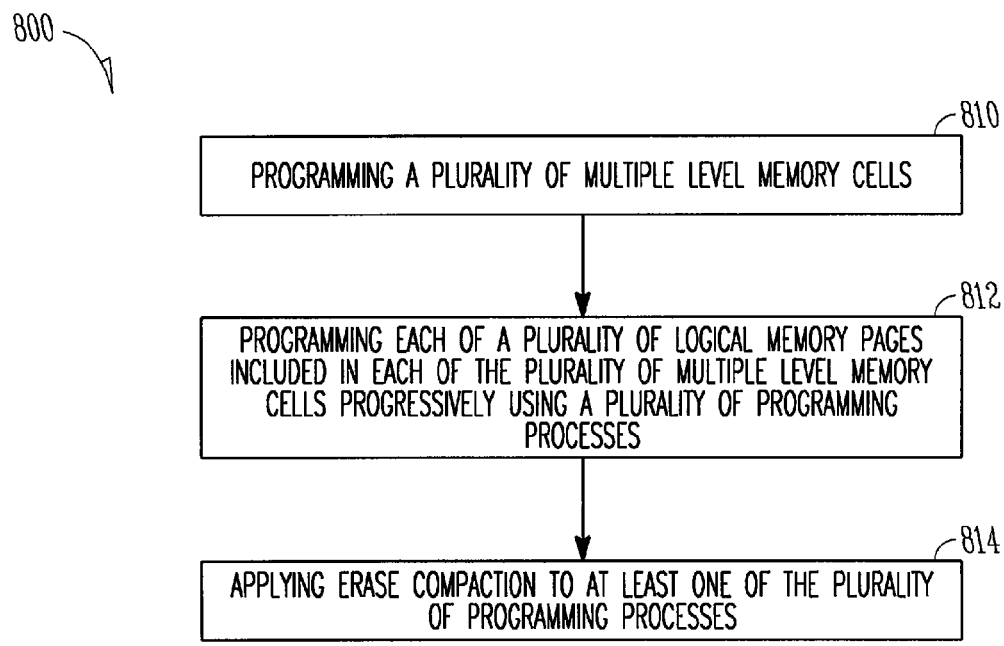
FIG. 8 illustrates a flow diagram showing one or more methods according to various embodiments of the invention.

FIG. 8 is a flow diagram including several methods according to various embodiments of the invention.

Method 800 may include at block 810 programming a plurality of multiple level memory cells.

Method 800 may include at block 812 programming each of a plurality of logical memory pages included in each of the plurality of multiple level memory cells progressively using a plurality of programming processes.

In various embodiments, programming each of a plurality of logical memory pages includes providing a first threshold voltage distribution closest to a range of threshold voltages representative of threshold voltage distributions of erased memory cells, the first threshold voltage distribution having a wider setting than at least a second threshold voltage distribution representative of threshold voltage distributions other than the threshold voltage distribution representative of the threshold voltage distributions of erased memory cells.

Method 800 may include at block 814 applying erase compaction to at least one of the plurality of programming processes. In various embodiments, applying erase compaction includes following the programming of a logical memory page in at least one of the plurality of logical memory pages in a first one of the plurality of memory cells, providing in the first one of the plurality of memory cells a second threshold voltage distribution representative of a range of threshold voltages for an erased memory cell that is narrower than a first threshold voltage distribution representative of a range of threshold voltages for an erased memory cell before the programming of the logical memory page.

In various embodiments, applying erase compaction includes following the programming of a logical memory page in at least one of the plurality of logical memory pages in a first one of the plurality of memory cells, providing in the first one of the plurality of memory cells a first threshold voltage distribution representative of a range of threshold voltages for an erased memory cell that is closer in voltage to a second threshold voltage distribution representative of a range of threshold voltages for a programmed multiple level memory cells than the first threshold voltage distribution was before the programming of the logical memory page.

In various embodiments, applying erase compaction includes following the programming of a logical memory page in at least one of the plurality of logical memory pages in a first one of the plurality of memory cells, providing in the first one of the plurality of memory cells a first threshold voltage distribution representative of a range of threshold voltages for an erased memory cell that is closer in voltage to a second threshold voltage distribution representative of a range of threshold voltages for a programmed multiple level memory cells than the first threshold voltage distribution was before the programming of the logical memory page.

In various embodiments, a system such as system 130 of FIG. 1 may include a machine-readable medium on which is stored one or more sets of instructions, for example instructions 121 or instructions 111 embodying any one or more of the methodologies or functions described herein, including those methods illustrated in FIG. 7. The instructions may also reside, or be stored in, completely or at least partially, within the memory device 100, or within the processor 120 during execution thereof by the system. The memory array 102 and the processor 120 also may constitute machine-readable media. The instructions 624 may further be transmitted or received over a network 626 via the network interface device 620.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims and the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments and other embodiments not specifically described herein will be apparent to those of skill in the art upon reviewing the above description.

Voltage magnitudes for "low" logic signals and "high" logic signals are normally not defined since they can have a variety of relative values including negative voltages and positive voltages. "High" and "low" logic signals are defined only by their relationship to one another in representing binary values. Typically, a "high" logic signal has a voltage level or potential higher than a "low" logic signal, or the "low" signal may have a different polarity or negative polarity than the "high" signal. As those skilled in the art well understand, in some logic systems, a "high" logic value may even be represented by a ground potential when the relative "low" logic value is represented by a negative voltage potential in reference to ground.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

CONCLUSION

Methods, apparatus and systems have been disclosed for multiple level flash memory cells. Various embodiments include a progressive programming of a plurality of multiple level flash memory cells, wherein the sequence for programming the individual logical memory pages within at least one multiple level memory cell is separated for another programming of an individual logical memory page within the same multiple level memory cell by programming processes performed on the logical memory pages of one or more other multiple level memory cells. Various embodiments include using erase compaction in programming multiple level memory cells. Various embodiments include providing at least one wider threshold voltage range for a threshold voltage range representative of a programmed multiple level memory cell, wherein the wider threshold voltage range is a threshold voltage range other than the threshold voltage range designated as indicating an erased memory cell.

By including one or more of the embodiments disclosed herein, tight control over the programming of the voltage distribution ranges may be provided while reducing the effect of FG-FG interference. In addition, use of one or more of the embodiments disclosed herein may improve program speed ($t_{prog}$) compared to conventional programming that program all of the logical memory pages in a multiple level memory cell from an erase state to all data bits being programmed at the same time. In various embodiments, erase compaction including gradually compacting the erase threshold voltage through soft programming reduces FG-FG interference, while providing tight control over threshold voltage distributions. In various embodiments, providing a wider threshold voltage distribution adjacent to the erase threshold voltage distribution allows for faster programming speed and provides a reduced failure rate in multiple level memory cells.

What is claimed is:

1. An apparatus comprising:
a plurality of multiple level memory cells, each of the plurality of multiple level memory cells coupled to one of a plurality of wordlines and each of the plurality of multiple level memory cells including a plurality of logical memory pages; and
a control circuit coupled to the plurality of wordlines, the control circuit operable to progressively program each of the plurality of multiple level memory cells in at least one sequence including separation of the programming of a first logical memory page and a second logical memory page in any one of the plurality of multiple level memory cells by at least N−1 programming operations to memory cells either coupled to a different wordline or included in a different logical even page or a different logical odd page from the any one of the plurality of multiple level memory cell that includes the first logical memory page and the second logical memory page, wherein N is an integer equal to the number of data bits the plurality of multiple level memory cells are operable to store.

2. The apparatus of claim 1, further including a first plurality of bitlines coupled to the control circuit and to a first group of the plurality of multiple level memory cells in a logical even page, and a second plurality of bitlines coupled to the control circuit and to a second plurality of the multiple level memory cells in a second logical page.

3. The apparatus of claim 1, wherein the plurality of multiple level memory cells includes at least one NAND flash memory cell.

4. The apparatus of claim 1, wherein at least one of the plurality of multiple level memory cells includes at least one memory cell operable to store at least four bits of data.

5. The apparatus of claim 1, wherein a first portion of the plurality of multiple level memory cells coupled to a same wordline are included in a first logical page, and a second portion of the multiple level memory cells coupled to the same wordline are included in a second logical page.

6. The apparatus of claim 1, further including the control circuit including stored instructions including a sequence of logical page numbers for programming at least a portion of the plurality of multiple level memory cells.

7. The apparatus of claim 1, wherein at least one of the plurality of multiple level memory cells includes having a threshold voltage within one of at least sixteen designated threshold voltage distributions.

8. The apparatus of claim 1, wherein at least one of the plurality of multiple level memory cells includes having a threshold voltage within a lowest positive threshold voltage distribution of a plurality of designated threshold voltage distributions, the lowest positive threshold voltage distribution including a wider range of threshold voltages than any other of the plurality of designated threshold voltages that include positive threshold voltages.

9. A method comprising:
programming a first logical memory page of a first multiple level memory cell; and
programming at least N−1 other logical memory pages in one or more other multiple level memory cells in a same memory block as the first multiple level memory cell before programming a second logical memory page of the first multiple level memory cell, wherein N is an integer equal to the number of data bits the first multiple level memory cell is operable to store.

10. The method of claim 9, wherein the first logical memory page is one of a first lower page, a second lower page, and a third lower page of the first multiple level memory cell.

11. The method of claim 9, wherein the second logical memory page of the first multiple level memory cell is the second lower page, if the first logical memory page is the first lower page of the first multiple level memory cell.

12. The method of claim 9, wherein the second logical memory page of the first multiple level memory cell is an UPPER page, if the first logical memory page is the third lower page of the first multiple level memory cell.

13. The method of claim 9, wherein programming the at least N−1 other logical memory pages includes programming as a first of the at least N−1 other logical memory pages a first logical memory page of a second multiple level memory cell of the one or more other multiple level memory cells, wherein the second multiple level memory cell is coupled to a same wordline as the first multiple level memory cell, and is in a different logical page than a logical page that includes the first multiple level memory cell.

14. The method of claim 9, wherein programming the at least three other physical pages includes programming as a second of the at least three other physical pages a first physical page of a third multiple level memory cell of the one or more other multiple level memory cells, wherein the third multiple level memory cell is coupled to a different wordline from the same wordline coupled to the first multiple level memory cell, and is in the logical page that includes the first multiple level memory cell.

15. The method of claim 14, wherein the different wordline is a next adjacent wordline in the same memory block.

16. The method of claim 9, wherein programming the at least three other physical pages includes programming as a third of the at least three other physical pages a second physical page of the second multiple level memory cell of the one or more other multiple level memory cells, wherein the second multiple level memory cell is coupled to a different wordline from the same wordline that includes the first multiple level memory cell, and is in a different logical page from the logical page that includes the first multiple level memory cell.

17. The method of claim 9, wherein programming at least N−1 other physical pages includes programming N−1 other physical pages and then programming the second physical page of the first multiple level memory cell.

18. A method comprising:
programming a plurality of multiple level memory cells, including, programming each of a plurality of logical memory pages included in each of the plurality of multiple level memory cells progressively using a plurality of programming processes, and applying erase compaction to at least one of the plurality of programming processes.

19. The method of claim 18, wherein applying erase compaction includes after the programming of a logical memory page in at least one of the plurality of logical memory pages in a first one of the plurality of memory cells, designating a second range of threshold voltages as the range of threshold voltages included in a threshold voltage distribution associated with an erased memory cell, wherein the second range of threshold voltages includes a second range of threshold voltages that is smaller than a fist range of threshold voltages designated as a first range of threshold voltages included in a first threshold voltage distribution associated with the erased memory cell before the programming of the logical memory page.

20. The method of claim 18, wherein applying erase compaction includes after the programming of the logical memory page in at least one of the plurality of logical memory pages in the first one of the plurality of memory cells, performing a compaction verification operation.

21. The method of claim 20, wherein performing a compaction verification operation includes measuring a current for at least one of a series string including at least one of the memory cells programmed.

22. A machine-readable medium having instructions stored thereon that, when executed by a machine, cause the machine to perform:

programming a first logical memory page of a first multiple level memory cell; and programming at least N–1 other logical memory pages in one or more other multiple level memory cells in a same memory block as the first multiple level memory cell before programming a second logical memory page of the first multiple level memory cell, wherein N is an integer equal to the number of data bits the first multiple level memory cell is operable to store.

23. The machine-readable medium of claim 22, wherein programming a first logical memory page includes programming a third lower page LP-3 of the first multiple level memory cell.

24. An apparatus comprising:

a plurality of multiple level memory cells, each of the plurality of multiple level memory cells coupled to one of a plurality of wordlines and included in either a logical even page or a logical odd page coupled to each one of the plurality of wordlines, each of the plurality of multiple level memory cells including N logical memory pages, wherein N is an integer equal to the number of data bits each of the plurality of multiple level memory cells is operable to store; and at least one of the plurality of multiple level memory cells including a programmed memory cell having all of the N logical memory pages included in the programmed memory cell programmed with a data bit, the programmed memory cell coupled to a first wordline of the plurality of wordlines and the programmed memory cell included in either the logical even page or the logical odd page coupled to the first wordline;

wherein any of the plurality of multiple level memory cells either coupled to a wordline adjacent to the first wordline or coupled to the first wordline and on a different logical even page or a different logical odd page from the programmed memory cell have at least N–1 logical memory pages programmed with a data bit, and at least one of the any of the plurality of multiple level memory cell has no more than N–1 logical memory pages programmed.

25. The apparatus of claim 24, wherein at least one of the any of the plurality of multiple level memory cells has no more than N–1 logical memory pages programmed when all of the plurality of multiple level memory cells either coupled to a wordline adjacent to the first wordline or coupled to the first wordline and included in a different logical even page or a different logical odd page from the programmed memory cell have at least N–1 logical memory pages programmed with data bits.

26. The apparatus of claim 24, wherein each of the plurality of multiple level memory cells includes 4 logical memory pages.

27. A system comprising:

a processor coupled to a plurality of multiple level memory cells, each of the plurality of multiple level memory cells coupled to one of a plurality of wordlines and each of the plurality of multiple level memory cells including a plurality of logical memory pages; and a control circuit coupled to the plurality of wordlines, the control circuit operable to progressively program each of the plurality of multiple level memory cells in at least one sequence including separation of the programming of a first logical memory page and a second logical memory page in any one of the plurality of multiple level memory cells by at least N–1 programming operations to memory cells either coupled to a different wordline or included in a different logical even page or a different logical odd page from the any one of the plurality of multiple level memory cell that includes the first logical memory page and the second logical memory page, wherein N is an integer equal to the number of data bits the plurality of multiple level memory cells are operable to store.

28. The system of claim 27, wherein the processor further includes stored instructions operable for programming the plurality of multiple level memory cells.

29. The system of claim 27, wherein the processor coupled to the plurality of multiple level memory cells further includes a digital camera.

* * * * *

UNITED STATES PATENT AND TRADEMARK OFFICE
CERTIFICATE OF CORRECTION

PATENT NO. : 7,619,918 B2  Page 1 of 1
APPLICATION NO. : 11/618661
DATED : November 17, 2009
INVENTOR(S) : Aritome It is certified that error appears in the above-identified patent and that said Letters Patent is hereby corrected as shown below:

In column 21, line 15, in Claim 19, delete "fist" and insert -- first --, therefor.

Signed and Sealed this

Second Day of February, 2010

David J. Kappos
*Director of the United States Patent and Trademark Office*